United States Patent

Munits et al.

[11] 4,164,659
[45] Aug. 14, 1979

[54] METHOD OF MONITORING THE PHASE STATE OF MATERIAL IN PROCESSES INVOLVING CRYSTALLIZATION FROM MELT AND APPARATUS FOR PERFORMING SAME

[75] Inventors: Ilya N. Munits; Sergei E. Maraev, both of Leningrad, U.S.S.R.

[73] Assignee: Vsesojuzny Nauchno-Issledovatelsky I Proektny Institut Aljuminievoi, Magnievoi I Elektrodnoi Promyshlennosti, U.S.S.R.

[21] Appl. No.: 751,349

[22] Filed: Dec. 16, 1976

[51] Int. Cl.² .................... G01N 21/22; H01J 39/12
[52] U.S. Cl. ...................................... 250/561; 250/202
[58] Field of Search ............................ 250/561, 202

[56] References Cited

U.S. PATENT DOCUMENTS

| 3,190,159 | 6/1965 | Wilkie et al. ................ 250/202 X |
| 3,527,953 | 9/1970 | Chitayat ........................ 250/561 |
| 3,673,414 | 6/1972 | Taniguchi et al. ............. 250/561 |

*Primary Examiner*—Palmer C. Demeo
*Attorney, Agent, or Firm*—Lackenbach, Lilling & Siegel

[57] ABSTRACT

While monitoring the phase state of a material in processes including crystallization from a melt, a photo-optical system is operated to receive the radiation coming from the material being treated, and the amplitude-frequency spectrum of the output electric signal of the photoreceiver of this system is followed. The presence in this signal of a low-frequency components within a range of from 0.5 to 30 Hz indicates that the optical system is located above the molten portion of the material being treated. To utilize this method for monitoring the position of the interface between the solid and molten zones or phases, there is employed a carriage supporting thereon the photo-optical system and mounted for reciprocation transversely of the interface between the liquid and solid phases. The output of the photoreceiver of the photo-optical system is provided with a frequency-amplitude analyzer including a circuit for inhibiting the permanent component. The drive of the carriage includes a stepping motor connected to the output of the analyzer and adapted to be controlled by the input signals of the latter so that upon the appearance at the output of the analyzer of a signal containing the low-frequency component the carriage is displaced toward the solid phase, whereas upon the absence in the input signal of the low-frequency variable component the said carriage is displaced toward the liquid phase of the material.

12 Claims, 5 Drawing Figures

METHOD OF MONITORING THE PHASE STATE OF MATERIAL IN PROCESSES INVOLVING CRYSTALLIZATION FROM MELT AND APPARATUS FOR PERFORMING SAME

BACKGROUND OF THE INVENTION

The present invention relates to a method of monitoring the phase or state of a material in a process including crystallization from a melt and to an apparatus capable of performing such a method.

The present invention can be utilized during zone melting of metals and semiconductors, as well as in growing of single crystals, at pulling of shaped articles from a malt and in a number of other metallurgical and like processes including crystallization treatment of materials.

it is known that to ensure a high degree of purification, to obtain a highly homogenous structure and to provide for accurate geometrical dimensions of the ingots produced, it is essential to determine with a high degree of accuracy the location and more often than not the shape of the interface between the solid and liquid phases. The presence of reliable information on the current coordinates and shape of the interface makes it possible to effect the optimum automatic control of the corresponding production processes.

However, the main difficulty in determining the interface between the liquid and solid phases consists in identification of these phases.

Known in the art are methods of determining the phase states and, hence, the location of the interface between the liquid and solid phases, based on a comparative analysis of either the intensity or of the spectral characteristics of radiation energy coming from the melt and from the solid crystallized structure adjoining this melt.

However, in most hitherto known cases these methods fail to discriminate between the liquid and solid phases with adequate reliability and thus to locate with adequate accuracy the interface therebetween.

Thus, in zone melting of aluminum the factor of the radiant capacity of the crystallized surface of an ingot is a highly unstable value depending on the roughness of the surface, the degree of its oxidation thereof and on other factors which are difficult to monitor. The absolute value of the factor of the blackness of this surface might be the same as the similar characteristic of the surface of molten aluminum, particularly when the latter is covered with oxide and slag films. Consequently, the comparison between the intensities of the flows of radiation energy received by the photo-optical follow-up system, respectively, from the solid and liquid phases fails to determine the position of the interface between the phases.

Another fact which hampers the measurement of the absolute values and spectral characteristics of the flows of radiation energy coming from the surfaces being inspected is the gradual build-up of deposits on the inspection windows through which the process is being followed of dark opaque deposits of volatile impurities, metal vapors, graphite particles and other sublimants. The optical density of these deposits tends to drift in time and to vary over the area of the window, whereby these deposits have introduced both spectrum-wise and amplitude-wise errors which affect the accuracy of the comparative measurements of these flows of radiation energy.

The abovedescribed hitherto known methods are usually performed by apparatus comprising a carriage reciprocable transversely of the interface of the solid/liquid phases, the carriage supporting thereon a photo-optical system. This photo-optical system includes an objective lens and a photoreceiver or phototransducer adapted to receive upon the reciprocation of the carriage the radiation coming either from the solid phase or from the liquid phase of the substance being treated.

Connected to the output of the photoreceiver or phototransducer is an analyzer of the output signal of this photoreceiver or phototransducer. It is supposed that the output signal of the phototransducer would be different, depending on whether it is aimed at the melt or at the solid part of the ingot, and, thus, by detecting the moment of a change of this output signal, it would be possible to monitor the position of the interface between the solid and liquid phases. However, the hitherto known apparatus have the same inherent disadvantages which have been described hereinabove in connection with the methods performed in these apparatus, whereby the character of the variation of the output signal of the phototransducer under the action of various disturbances in a number of instances is not directly related to the position of the photo-optical system with respect to the interface. Therefore, the positions into which the carriage is driven as a result of the analysis of the output signal of the phototransducer are but to a certain extent representative of the actual location of the interface being monitored, the error sometimes attaining significant values.

It is an object of the present invention to create a method providing reliable recognition and identification of the phase states of the material being treated and of the interface between the phases, irrespectively of the change of irradiation properties of the surfaces of these phases.

It is another object of the present invention to preclude the influence of the gradual, time-related darkening of the inspection windows upon the outcome of the measurements.

It is a further object of the present invention to provide an apparatus for practical realization of the herein disclosed method of comparative analysis of the radiation energy flow coming from the solid and liquid phases and for monitoring with a high degree of accuracy the position of the interface between the solid and liquid phases.

It is still another object of the present invention to provide an apparatus for detecting the shape of the interface between the liquid and solid phases.

Among other objects of the invention it is worth to mention that of increasing the efficiency of the process being inspected and of stabilizing the quality of the product of this process.

BRIEF DESCRIPTION OF THE INVENTION

With these and other objects in view, the present invention resides in a method of monitoring the phase state of a material in a process involving crystallization from a melt, including operating a photo-optical system adapted to receive the radiation coming from the material being treated and using the characteristics of the output signal of this system to identify the phasewise state of the material, in which method, in accordance with the present invention, there follows the amplitude frequency spectrum of the electric output signal of the photo-optical system a low-frequency component being considered representative of the molten state of the material.

The advantage offered by the herein disclosed method is that of utilizing a new mesurement parameter, viz. the amplitude-frequency spectrum of the variable component of the radiation energy flow, which provides for reliable discrimination between the solid and liquid phases in the processes of crystallization treatment of metals and of other substances, where the difference between the spectral irradiation properties of the melt and of the solid body is relatively small.

It is most expedient to use the herein disclosed method to monitor the position of the interface between a liquid phase and a solid one, in which a low-frequency component in the output electric signal of the photo-optical system is displaced toward the solid phase portion, the abrupt discontinuation of the low-frequency signal being considered representative of the interface being traversed by the line of view of the photo-optical system. In the absence of the low-frequency signal the optical system is displaced toward the liquid phase portion, the appearance of the low-frequency component being considered representative of the interface being traversed.

The required output signal can be produced either by a single phototransducer scanning the area adjoining the interface, or else by receiving the radiation simultaneously by two phototransducers mounted symmetrically with respect to the optical line of the photo-optical system, a change of the inverse character of the output signals of these phototransducer being taken as an indication of the alignment of the optical line of the system with the interface.

It is most expedient to perform the measurement in the infrared zone of the spectrum, to render the results of the measurements independent from the degree of the darkening of the inspection window through which the process is being followed. Since the deposits on the window feature selective absorption of various wavelengths, it is expedient that the analysis of the variable component of the flow of the radiation energy is performed in the region of the spectrum, which is not completely adsorbed by the deposits, e.g. in the near infrared zone. It is worth mentioning in this connection that the gradual reduction of the absolute value of the flow of radiation energy admitted by the inspection window with time of the operation of the apparatus would not affect the outcome of the comparative analysis of the radiation energy flow coming from the liquid and solid phases, since this analysis, as it has been already mentioned, is based on either the presence or the absence of a characteristic low-frequency spectrum of the variable component.

As it has been stated, the best results are obtained when the low-frequency signals are observed within a range of from 0.5 to 30 Hz.

The herein disclosed method of monitoring the position of the interface between the solid and liquid phases can be performed by an apparatus comprising a carriage connected with a controllable drive, mounted for reciprocation in a direction which is transverse relative to the interface between the molten and solid phases and carrying a photo-optical system adapted to receive the radiation coming from the ingot of the material being treated, the system including a circuit capable of analyzing the electric output signal of the photoreceiver or phototransducer of this system, the variation of the output signal of this circuit being used to determine the position of the optical line of the photo-optical system relative to the solid/liquid state interface, the carriage being provided with the drive for displacement in accordance with the variation of the output signal of the amplitude-frequency analyzer in which apparatus, in accordance with the invention, the output of the phototransducer is connected to an amplifier provided with a circuit for suppressing the direct component of the signal, the drive of the carriage including a stepping motor adapted to be controlled by the output signal of the analyzer.

The advantages of the apparatus proposed for performing the method being under consideration are the high degree of accuracy in determining the coordinates of the interface location and the stability of the process of following up the interface with the photo-optical system.

It is expedient that the photo-optical system consist of two photoreceivers or phototransducers, in which case the circuit analyzing their output signal has two channels, each one of the channels including a frequency-amplitude analyzer connected to the respective one of the two phototransducers, each one of the two analyzers having a direct and an inverted output, the similar outputs of the analyzers being jointly connected to respective AND gates having their outputs connected to the control switches of the stepping motor.

It is also expedient that the photoreceiving system include a prism with two light-reflecting faces and two phototransducers mounted symmetrically with respect to the edge of the prism, defined by the intersection of the two light-reflecting faces.

It is further expedient that the apparatus include a source of visible radiation, positioned so that the illumination thereof is directed along the optical line of the photoreceiver of the system, to enable adjustment of the optical system to the initial position by visual observation, which additionally provides for visual observation of the orientation line of the optical system, for simplified setting of the reference point of the travel of the carriage, for visual inspection of the performance of the apparatus.

It is still further expedient that the carriage be provided with two controllable stepping drives for displacing the carriage in two perpendicular directions, the motor being adapted to displace the carriage along the interface providing for the motion of the carriage at a permanent speed. The motors should be associated with reversible counters of the number of their steps, which would enable the use of motors for determining the configuration of the interface between the solid and liquid phases, which is essential for controlling the conditions of dislocationless growth of crystals.

BRIEF DESCRIPTION OF THE DRAWINGS

The invention will be further described in connection with embodiments thereof, as utilized for determining the location of the solid/liquid interface, with reference being had to the accompanying drawings, wherein.

DESCRIPTION OF THE PREFERRED EMBODIMENTS

The herein disclosed method is based on the rule we have reduced, viz. that of the amplitude and the frequency spectrum of the variable component of the radiation energy flow issued, respectively, by the melt and by the solidified portion of an ingot being substantially different.

The flow of radiation energy issued by the melt includes a low-frequency modulation variable component brought about by the unceasing deformation of the surface of the melt under the action of various mechanical vibrations to which the plant is unavoidably subjected to, as well as by the action of electromagnetic forces created by the inductor, in cases when the melted zone is produced and maintained by induction heating. As stated by the tests we have carried out, the oscillation frequency of this variable component is usually within a 0.5 to 30 Hz range. The amplitude and the frequency spectrum of the variable component of the radiation energy flow coming from the melt, however, is sharply different from similar characteristics of the variable component present in the flow of radiation energy coming from the crystallized ingot. The above-mentioned variable component is brought about only by the relatively small relative vibrating displacement of the surface being monitored with respect to the monitoring photo-optical system and by the high-frequency noise present in the signal of the phototransducer.

Figure 1:
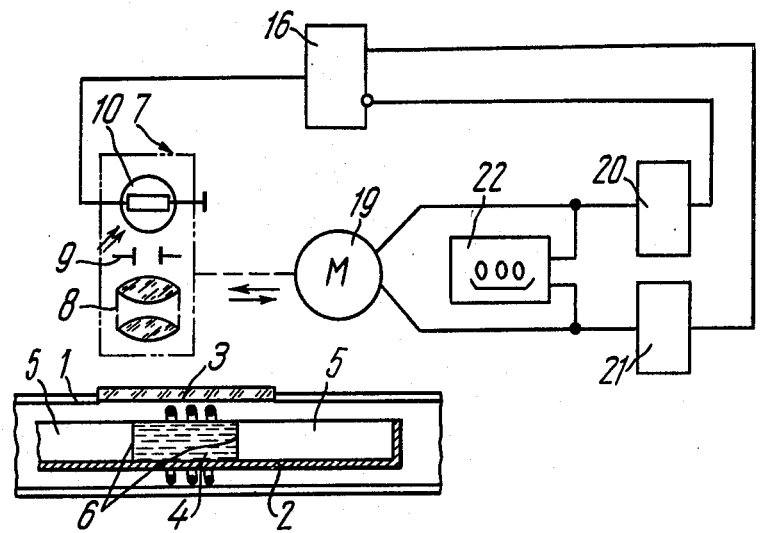
FIG. 1 is a schematic representation of an apparatus for determining of the interface between solid and liquid phases of an ingot of a material being treated in accordance with the present invention.

Let us now consider the illustration in FIG. 1 showing a portion of the process chamber 1 of an apparatus for horizontal zone melting. A container 2 with a charge of a material to be purified moves within this process chamber.

The chamber 1 is provided with an inspection window 3 through which the molten zone 4 and adjoining solidified portions 5 can be watched. The interfaces between the molten zone 4 and the solidified portions 5 are indicated for illustration purposes with lines 6.

The photo-optical system 7 includes an objective lens 8, a slit diaphragm 9 and a photoreceiver or phototransducer 10. These components of the photo-optical system are mounted on a carriage (not shown in FIG. 1 for clarity sake). Let us merely state that this carriage should be mounted for reciprocation is a direction transverse of the interface being monitored. An embodiment of such a carriage will be considered in more detail hereinbelow, in connection with FIG. 5.

The photoreceiver or phototransducer 10 may be in the form of either a photodiode or a photoresistor. It is most expedient to employ a phototransducer having its maximum lies response lies in the near infrared zone. The output of the phototransducer is connected to an analyzer 16 of the amplitude-frequency spectrum of the variable component.

The actual circuitry of this device may be varied to fit the particular features of the frequency spectrum of the variable component, which spectrum, in turn, is defined by the nature of the deformation of the surface of the melt, by the natural frequency of oscillation of the volume of the molten substance, by the viscosity of the melt, etc. Low-frequency variable components in the photoreceiver signal may be determined by correlation methods and by band-pass filters.

Figure 2:
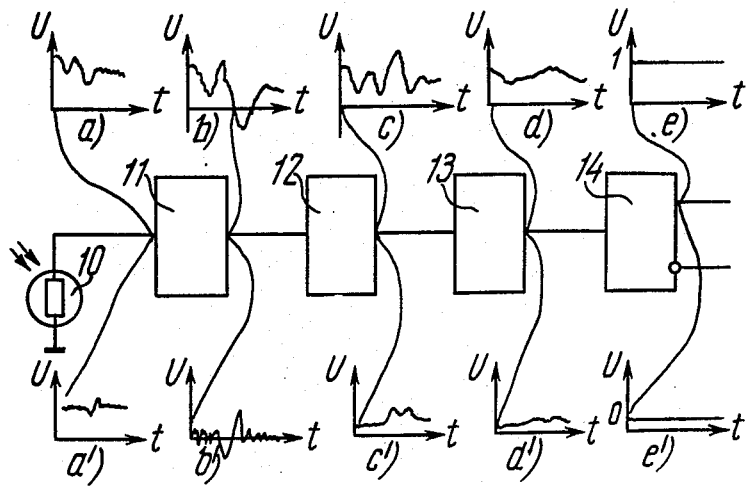
FIG. 2 is a block diagram of a circuit which may be used in conjunction with the apparatus of FIG. 1 for investigating the amplitude of a variable component.

In numerous cases it is quite sufficient to amplify and investigate the amplitude of the variable component in a circuit of which the block unit diagram is shown in FIG. 2. In this circuitry, the output of the phototransducer 10 is connected to a variable-voltage amplifier 11 which also acts as a suppressor of the permanent or DC component.

The amplifier 11 is preferably a frequency-selective amplifier tunable to a frequency range corresponding to the spectrum of the low-frequency signal and varying from 0.5 to 30 Hz.

The output of the amplifier 11 has serially connected thereto an amplitude detector 12 connected to an integrator-filter 13, which latter effects an input of a Schmidt trigger or flip-flop 14.

Let us now consider the operation of the apparatus illustrated in FIG. 1, so that the essence of the herein disclosed method can be better understood.

Let us presume that the photo-optical system 7 is positioned so that its line of vision falls upon the surface of the melt 4. The radiation issued by this melt 4 includes the low-frequency variable component (FIG. 2a) which is amplified and separated from the permanent component in the amplifier 11 (FIG. 2b), to be then rectified by the amplitude detector 12 (FIG. 2c). The rectified signal is levelled-out in the integrator-filter 13, the output signal depending on the value of the variable component (FIG. 2d). This levelled-out signal is fed to the Schmidt trigger 14, and if the value of this voltage either attains or surpasses the triggering voltage of this Schmidt trigger 14, the latter feeds from the output thereof a "1" logical signal (FIG. 2e) which is considered as in indication of the molten state of the substance.

Following this output signal of the trigger, the carriage is driven toward the solidified part of the ingot. Upon the line of vision of the optical system 7 traversing the interface 6, the amplitude of the low-frequency variable component sharply drops, so that the frequency spectrum undergoes radial changes (FIG. 2a'). Consequently, the values of the respective signals at the outputs of the amplifier 11 (FIG. 2b'), of the detector-rectifier 12 (FIG. 2c') and of the integrator 13 (FIG. 2d') decrease, the last-mentioned signal dropping below the triggering voltage of the Schmidt trigger 14, whereby the latter resumes its initial state and feeds from its output a logical "0" signal (FIG. 2e') which is an indication of the solid phase, and the motion of the carriage is reversed. The carriage supporting thereon the photo-optical system 7 is driven toward the interface 6, and upon the line of vision of the system once again encountering the melt 4, the low-frequency variable component re-appears in a step-wise fashion in the output signal of the phototransducer 10 (FIG. 2a), whereby the motion of the carriage is again reversed, as has been already described. Therefore, the photo-optical system is driven through self-induced scanning oscillation relative to the interface between the phases.

The span of the self-induced oscillatory motion of the carriage and, hence, the resolution of this device for measuring (determining) the coordinates of the interface, is defined by the structural and design parameters of the photo-optical system and in a general case equals two diameters of the scanning dot.

The abovedescribed apparatus, although of a simple structure, has its carriage continuously driven which leads to a rapid wear of the mechanical parts of the apparatus, while the presence of the self-oscillation component in the information representative of the current coordinates of the apparatus is capable of obstructing the creation of a fully automatic interface position follow-up and control system incorporating this apparatus. The apparatus illustrated in FIG. 3 and described hereinbelow enables to eliminate these disadvantages of the apparatus described in connection with FIG. 1.

Figure 3:
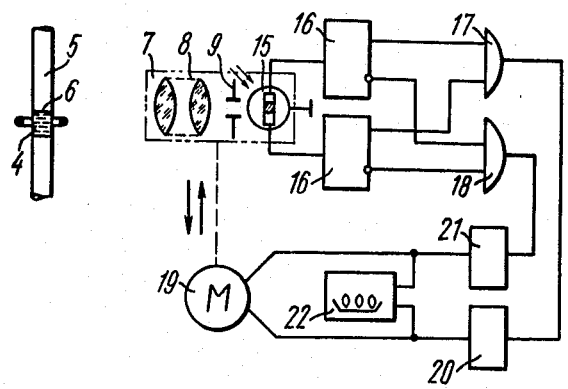
FIG. 3 is another embodiment of the apparatus in accordance with the present invention wherein a photo-optical system includes a phototransducer having two light-responsive elements.

Let us consider the apparatus illustrated in FIG. 3 in relative detail. The illustrated apparatus is employed in the process of floating zone melting, which, however, by no means precludes its utilization in numerous other processes.

The components which are similar to those described in connection with FIG. 1 are referred to with the same reference numerals previously used. The photo-optical system 7' illustrated in FIG. 3 is basically the same as that in FIG. 1, with the difference that the phototransducer 15 has two light-responsive elements mounted on the same backing plate. The outputs of these light-responsive elements of the phototransducer 15 are connected to respective amplitude-frequency spectrum analyzers 16. The block unit diagram of the analyzer is illustrated in FIG. 2 and has been described in detail hereinabove. The main and inverted outputs of the analyzers are connected in pairs to logical AND gates 17 and 18 controlling the direction of rotation of the stepping motor 19 driving the carriage supporting the photo-optical system 7. The control circuit of the stepping motor includes switches 20 and 21 and a reversible counter 22 which acts as a source of output information representative of the coordinates of the photo-optical system 7.

The apparatus operates, as follows.

If the optical line of the optical system is aligned with the interface 6 between the solid and liquid phases, one of the light-responsive elements of the twin phototransducer 15 receives the radiation issued by the melt, while the other element receives the radiation issued by the solidified part of the ingot. The signals at the similar outputs of the analyzers 16 have opposing senses or phases and, consequently, at the inputs of the AND gates 17 and 18 the condition of coincidence of the logical variables is not satisfied, whereby the stepping motor 19 is deenergized.

Should the interface 6 become displaced, and both elements of the phototransducer 15 receive the radiation from the melt 4, signals appear at the "1" outputs of the analyzers 16 and are fed to the inputs of the AND gate 17.

This coincidence of "1" signals at the input of the AND gate 17 results in actuation of the switching circuit 20, and the stepping motor 19 starts moving the carriage with the photo-optical system 7 toward the crystalline portion of the ingot 5. Then, as soon as one of the elements of the phototransducer 15 receives radiation from the solid phase, a change of the signals takes place at the input of its respective analyzer 16, and the condition of coincidence of the signals at the input of the AND gate 17 ceases. The stepping motor 19 is deenergized, while the reversible counter 22 registers the actual current coordinate of the interface.

If both elements of the phototransducer receives radiation from the solid phase 5, both inputs of the AND gate 18 receive "1" signals appearing at the inverted outputs of the analyzers 16, whereby the switching circuit or switch 21 is actuated, and the stepping motor 19 is energized to move the carriage with the photo-optical system 7 towards the melt 4.

Thus, the interface-searching motion of the photo-optical system 7 is commenced when similar signals are sent by both elements of the twin phototransducer 15 and is discontinued the moment the optical line aligns with the interface 6 between the liquid and solid phases.

The motion of the photo-optical system 7 is in every case registered with a high accuracy by the reversible counter 22. To ensure correspondence between the readings of the reversible counter and the coordinates of the interface, measured in a system of reference related to the article being processed, in some production processes viewing the direction of the orientation of the photo-optical system is required.

Figure 4:
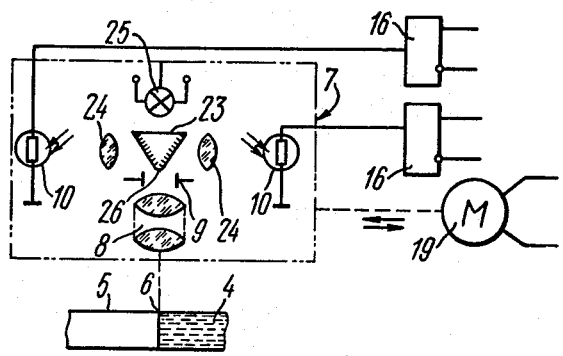
FIG. 4 is still another embodiment of the present invention, having a twin-channel structure as the embodiment shown in FIG. 3, but using a different design of the photo-optical system.

This viewing is offered by the apparatus illustrated in FIG. 4.

This apparatus likewise has a twin-channel structure, but it differs from the apparatus described hereinabove in connection with FIG. 3 by the design of the photooptical system 7.

Following the objective lens 8 and slit diaphragm 9 along the path of the radiation, there is positioned in the presently described apparatus a prism 23 with two reflecting side faces. Consequently, the radiation energy flow, divided by the prism 23 pass through condenser lenses 24 and are directed to the respective phototransducers 10. The base of the prism is illuminated by a source 25 of visible light.

The amplitude-frequency analyzers 16, the logical circuits 17 and 18 the switches 20 and 21, the motor 19 and the reversible counter 22 are similar to those described in connection with the previously mentioned FIGS. 2 and 3 and, therefore, in FIG. 4 the logical circuits switches and reversible counter are not shown.

The dividing prism 23 splits the field of vision of the photo-optical system into two scanning dots arranged symmetrically with respect to the optical line.

The radiation energy from these two parts or areas is directed by the side faces of the prism onto the respective phototransducers 10 to which there are connected in series the same circuits which have been described hereinabove in connection with FIG. 3.

The edge 26 of the prism 23, defined by the two reflecting faces, is oriented parallel with the interface being monitored.

The operation of searching for and following up the interface is similar to that of the apparatus described hereinabove in connection with FIG. 3.

Additionally, the image of the edge 26 of the prism 23, illuminated through the base thereof, is projected by the lens 8 into the surface being monitored as a thin strip of light indicating the point of the orientation of the photo-optical system 7. The width of this strip may be increased by making the edge 26 more blunt.

Figure 5:
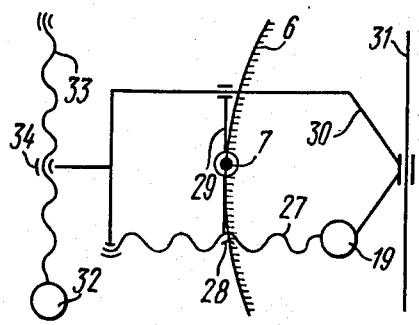
FIG. 5 is a schematic representation illustrating the drive diagram and showing the interaction of the carriages adapted to displace the photo-optical system in any one of the above-described embodiments.

Let us now consider FIG. 5 illustrating the drive diagram showing the interaction of the carriages adapted to displace the photo-optical system of any one of the above-described modifications.

The stepping motor 19 with aid of a lead screw 27 and nut 28 is capable of driving the carriage 29 (shown schematically) carrying the photo-optical systems 7 in a direction transverse of the interface 6 being monitored.

All the abovedescribed components and assemblies are mounted on the carriage 30 also movable along a guide 31 by a stepping motor 32 with aid of a lead screw 33 and nut 34, along the interface 6.

The stepping motor 19 drives the carriage 29 to continuously follow the interface. If the motor 32 is energized at a permanent speed, the carriage 29 is displaced along the interface, the photo-optical system 7 moving in space along a path coinciding with the shape of the interface. Therefore, during this scanning motion of the carriage 29 the reversible counter 22 registers a signal representing the deviation of the shape of the interface from a straight line.

The timing of the energization of the motor 32 is preset to correspond to the required repetition rate of the monitoring of the shape of the interface, while the scanning rate is selected in accordance with the follow-up rate of the photo-optical system.

What we claim is:

1. A method of monitoring the phase state of a material in processes including crystallization from a melt, comprising the steps of receiving radiation issuing from the material being treated; detecting said radiation and generating a corresponding electric output signal; and continously analyzing the amplitude-frequency spectrum of the electric output signal to determine the presence in this signal of a low-frequency component which is indicative of the state of the material.

2. A method as claimed in claim 1, wherein the radiation is received by a photo-optical system, and further comprising, in the presence of a low-frequency variable component in the electric output signal of the photo-optical system, the step of displacing the photo-optical system in the direction of the solid-phase area, the abrupt disappearance of the low-frequency signal being taken as an indication of traversing the interface, whereas, in the absence of the low-frequency variable component, the step of displacing the optical system toward the liquid-phase portion with attendant appearance of the low-frequency component being taken as an indication of traversing the interface.

3. A method as claimed in claim 2, wherein a single phototransducer of the photo-optical system is used to follow the interface.

4. A method as claimed in claim 2, wherein the radiation is received simultaneously by two phototransducers of the photo-optical system mounted symmetrically with respect to the optical line of the photo-optical system to generate output signals having opposing senses or phases and being taken as an indication of the alignment of the optical line of the system with the interface.

5. A method as claimed in claim 1, wherein the low-frequency signal which is followed has predominating frequency components within 0.5 to 30 Hz.

6. A method as claimed in claim 1, wherein the step of detection is performed in the infrared region of the radiation spectrum.

7. An apparatus for determining the interface between the solid and liquid phases of an ingot of a material being treated, comprising a carriage mounted for reciprocation in a direction substantially transverse of said interface, a photo-optical system with at least one phototransducer, supported by said carriage and adapted to receive radiation issuing from said ingot, the location of the interface being determined with respect to an optical line of said photo-optical system, a circuit for analyzing an output electric signal of said phototransducer comprising an amplitude-frequency analyzer connected to said phototransducer via a circuit for suppressing the DC or constant component of the output electric signal, a change of the output signal of said frequency-amplitude analyzer being used to determine the location of the optical line with respect to the interface, a drive associated with said carriage, including a controllable stepping motor the control circuit of which is connected to said analyzer to be controlled by the output signals thereof.

8. An apparatus as claimed in claim 7, wherein said photo-optical system includes two phototransducers, said circuit for analyzing the output signal of said photo-optical system being of a twin-channel structure, each channel thereof including a frequency-amplitude analyzer having a circuit for suppressing the DC or constant component, each one of said two analyzers having a direct output and an inverted one, the similar outputs of said two analyzers being connected jointly to a respective AND gate, the AND gates having their respective outputs connected to said control circuit of said stepping motor.

9. An apparatus as claimed in claim 8, wherein said photo-optical system includes a prism with two light-reflecting faces, said two phototransducers being mounted symmetrically with respect to the edge of said prism defined by the intersection of said light-reflecting faces thereof.

10. An apparatus as claimed in claim 8, including a source of visible radiation positioned so that the radiation thereof is directed along the optical line of said phototransducer of said system, to enable the use of visual techniques of adjusting said photo-optical system into the initial position thereof.

11. An apparatus as claimed in claim 7, wherein said drive of said carriage includes an additional controllable stepping motor adapted to move said carriage along the interface at a permanent speed.

12. An apparatus as claimed in claim 7, wherein said drive of said carriage includes a stepping motor for moving said carriage in a direction transverse of the interface between the phases and an additional stepping motor adapted to move said carriage along the interface at a permanent speed, each of said two motors being associated with a reversible counter adapted to register the number of the steps of the respective one of said motors.

* * * * *